(12) United States Patent
Reese et al.

(10) Patent No.: US 9,398,712 B2
(45) Date of Patent: Jul. 19, 2016

(54) CONNECTOR AND ELECTRONIC CIRCUIT ASSEMBLY FOR IMPROVED WET INSULATION RESISTANCE

(75) Inventors: Jason A. Reese, Auburn, MI (US);
Samar R. Teli, Midland, MI (US);
James R. Keenihan, Midland, MI (US);
Joseph A. Langmaid, Caro, MI (US);
Kevin D. Maak, Midland, MI (US);
Michael E. Mills, Midland, MI (US);
Timothy C. Plum, Midland, MI (US);
Narayan Ramesh, Midland, MI (US)

(73) Assignee: Dow Global Technologies LLC, Midland, MI (US)

( * ) Notice: Subject to any disclaimer, the term of this patent is extended or adjusted under 35 U.S.C. 154(b) by 323 days.

(21) Appl. No.: 13/821,833

(22) PCT Filed: Sep. 29, 2011

(86) PCT No.: PCT/US2011/053879
§ 371 (c)(1),
(2), (4) Date: Mar. 8, 2013

(87) PCT Pub. No.: WO2012/044762
PCT Pub. Date: Apr. 5, 2012

(65) Prior Publication Data
US 2013/0170149 A1    Jul. 4, 2013

Related U.S. Application Data

(60) Provisional application No. 61/388,174, filed on Sep. 30, 2010.

(51) Int. Cl.
*H02N 6/00* (2006.01)
*H05K 7/00* (2006.01)
(Continued)

(52) U.S. Cl.
CPC .............. *H05K 7/00* (2013.01); *H01R 13/5202* (2013.01); *H02S 20/25* (2014.12); *H02S 30/10* (2014.12); *H02S 40/34* (2014.12); *H01R 9/226* (2013.01); *Y02B 10/12* (2013.01)

(58) Field of Classification Search
CPC .......... H02S 20/25; H02S 30/10; H02S 40/34
USPC ....................................................... 136/251
See application file for complete search history.

(56) References Cited

U.S. PATENT DOCUMENTS 3,381,082 A    4/1968    LeBraun
3,767,471 A    10/1973    Kasper et al.
(Continued)

FOREIGN PATENT DOCUMENTS

CN    1578004 A    2/2004
DE    102007044329 A1    3/2008
(Continued)

OTHER PUBLICATIONS

Japanese Office action dated Feb. 5, 2014: Application No. 2011-531838.
(Continued)

*Primary Examiner* — Ramon M Barrera
(74) *Attorney, Agent, or Firm* — The Dobrusin Law Firm, P.C.; Daniel P. Aleksynas

(57) ABSTRACT

The present invention is premised upon a connector and electronic circuit assembly (130) at least partially encased in a polymeric frame (200). The assembly including at least: a connector housing (230); at least one electrical connector (330); at least one electronic circuit component (430); and at least one barrier element (530).

18 Claims, 8 Drawing Sheets

(51) Int. Cl.
  *H02S 30/10* (2014.01)
  *H01R 13/52* (2006.01)
  *H02S 40/34* (2014.01)
  *H02S 20/25* (2014.01)
  *H01R 9/22* (2006.01)

(56) References Cited

U.S. PATENT DOCUMENTS

| | | | |
|---|---|---|---|
| 4,465,575 | A | 8/1984 | Love et al. |
| 4,830,038 | A | 5/1989 | Anderson et al. |
| 4,863,535 | A | 9/1989 | More |
| 5,091,608 | A | 2/1992 | Gunther |
| 6,948,976 | B2 | 9/2005 | Goodwin et al. |
| 6,955,558 | B1 | 10/2005 | Low et al. |
| 7,012,188 | B2 | 3/2006 | Erling |
| 7,592,537 | B1 | 9/2009 | West |
| 7,642,449 | B2 | 1/2010 | Korman et al. |
| 7,654,843 | B2 | 2/2010 | Olson et al. |
| 7,655,508 | B2 | 2/2010 | Johnson et al. |
| 7,708,593 | B1 | 5/2010 | Gherardini et al. |
| 2001/0021103 | A1 | 9/2001 | Takagi |
| 2005/0011550 | A1 | 1/2005 | Chittibabu et al. |
| 2005/0059282 | A1 | 3/2005 | Uchida et al. |
| 2006/0207646 | A1 | 9/2006 | Terreau et al. |
| 2007/0256734 | A1 | 11/2007 | Guha et al. |
| 2008/0101002 | A1 | 5/2008 | Kim et al. |
| 2009/0311910 | A1 | 12/2009 | Kleinke |

FOREIGN PATENT DOCUMENTS

| | | |
|---|---|---|
| EP | 0841706 A2 | 5/1998 |
| EP | 1032051 A2 | 8/2000 |
| EP | 1058349 | 12/2000 |
| FR | 2841703 A1 | 1/2004 |
| JP | 2216874 A | 2/1989 |
| JP | H01-206573 | 8/1989 |
| JP | 2-3993 | 1/1990 |
| JP | 63-109957 | 3/1990 |
| JP | 2143468 A | 6/1990 |
| JP | H05-326046 | 12/1993 |
| JP | 10189924 A | 7/1998 |
| JP | 2000-82834 | 3/2000 |
| JP | 2000-348791 | 12/2000 |
| JP | 2001-253983 | 9/2001 |
| JP | 2004-087618 | 3/2004 |
| JP | 2007-527109 | 9/2007 |
| JP | 2008-66492 | 3/2008 |
| WO | 2009/137347 A2 | 11/2009 |
| WO | 2009137348 A2 | 11/2009 |
| WO | 2009137353 A2 | 11/2009 |

OTHER PUBLICATIONS

Written Opinion and Search Report for PCT/US2011/053879 mailed Feb. 8, 2012.
International Preliminary Report on Patentability dated Apr. 11, 2013; PCT/US2011/053879.
Japanese Office Action for Application No. 2015-003485 dated Sep. 30, 2015.
Chinese Office Action for Application No. 201180047570.0 dated Sep. 27, 2015.
Chinese Office Action, dated Dec. 31, 2014, Application No. 201180047570.0.

CONNECTOR AND ELECTRONIC CIRCUIT ASSEMBLY FOR IMPROVED WET INSULATION RESISTANCE

CLAIM OF PRIORITY

The present application claims the benefit of the filing date of U.S. Provisional Application No. 61/388,174 (filed 30 Sep. 2010) the contents of which are hereby incorporated by reference in their entirety.

This invention was made with U.S. Government support under contract DE-FC36-07G017054 awarded by the Department of Energy. The U.S. Government has certain rights in this invention.

FIELD OF THE INVENTION

The present invention relates to an improved connector and electronic circuit assembly for improved wet insulation resistance, more particularly an assembly that is at least partially encased within a polymeric frame.

BACKGROUND

Efforts to improve the state of the art in the area of solar power generation; particularly in the area of building mounted generation (also known as "Building Integrated Photovoltaics" or BIPV) has been receiving ever increasing industry focus over the last few years. BIPV products are exposed to significant variations in environmental loadings. They are preferably located in direct sunlight where they are subject to additional temperature loadings (beyond daily and seasonal ambient swings) due to radiant cooling and heating. It is possible for the devices to see 60 to 80° C. daily changes in more severe environments. The BIPV system design needs to address the impacts of these environmental conditions including ensuring good electrical contacts within and among components of the system.

Therefore, various testing protocols (e.g. UL 1703) are used to determine the product's capability to handle these temperature variations, for example as illustrated in FIG. 10. One test of particular interest performed on the product is a Wet Insulation Resistance test ("Wet Hi-pot"), found in UL 1703, section 27. For example, the PV device should not exhibit a dielectric breakdown as a result of an applied direct current voltage (e.g. about 500 volts) while immersed in a non-corrosive liquid. Moreover, there is a desire to ensure good electrical contact at the time of installation that will minimize electrical contact failures during usage. These tests may be required to be performed before and/or after thermal cycling of the device(s).

These protocols may also apply to a full photovoltaic system where two or more photovoltaic devices are connected together. Parts are subject to stresses and displacements relative to each other as they expand and contract with temperature changes. Similarly, the surface the photovoltaic devices are mounted to may change as a function of temperature, humidity, or as the structure settles with time. In cases where the connections are not connected with wires or flexible members there is likelihood of leakage paths at these device to device connections if not properly designed or installed. The issue of leakage paths is contemplated in both the connection of multiple devices and within a single device.

The present invention is directed to at least one unique solution to the problems discussed above.

Among the literature that may pertain to this technology include the following patent documents: U.S. Pat. No. 7,708,593; U.S. Pat. No. 7,655,508; U.S. Pat. No. 7,654,843; U.S. Pat. No. 6,948,976; U.S. Pat. No. 6,955,558; PCT/US20091042496; U.S. Pub. 20080101002; U.S. Pub. 2004711107A; U.S. Pat. No. 7,012,188; and U.S. Pat. No. 7,592,537 all incorporated herein by reference for all purposes.

SUMMARY OF THE INVENTION

It was found that some design versions BIPV shingles like those described herein were failing the Wet Hi-Pot test after exposure to as little as 50 dry thermal cycle and/or 3 wet thermal cycle conditions with what is believed to be an interface failure between the connector and multi-layer laminate structure. The relevant UL certification requirement is 200 dry thermal cycles and 10 wet thermal cycles, it is believed that failure to meet the requirements of the certification may be indicative of potential long term performance issues.

The present invention is directed to a. The invention is addressing one or more of the issues/problems discussed above.

Accordingly, pursuant to one aspect of the present invention, there is contemplated a connector and electronic circuit assembly at least partially encased in a polymeric frame, including at least a connector assembly, the connector assembly including at least a connector housing; at least one electrical connector protruding from the housing; an electronic circuit component comprising; at least one bus bar; and a connection zone where the at least one electrical connector and the at least one bus bar are joined; wherein the connection zone, the connector housing, or both including at least one elastomeric barrier element.

The invention may be further characterized by one or any combination of the features described herein, such as the at least one elastomeric barrier element maintains a minimum compression value of 5% to 30% when encased in the polymeric frame; the at least one elastomeric barrier element has a hardness between 20 to 100 Shore A Durometer per ASTM 02240 00; the at least one elastomeric barrier element includes at least one rib structure projecting away from a traverse length of the connector housing; the at least one rib structure has a height ranging between 0.5 mm to 2.5 mm; the polymeric frame has a Young's frame modulus and the at least one elastomeric barrier element has an Young's element modulus and further wherein a modulus ratio of the frame modulus to the element modulus at 23° C. is at least 500:1, the modulus ratio at −40° C. is at least 50:1, the modulus ratio at 85° C. is at least 10000:1; the modulus ratio of the frame modulus to the element modulus is within 10% of 120:1 at −40° C.; 2400:1 at 23° C.; and 14000:1 at 85° C.; the at least one elastomeric barrier element maintains an adhesive joint between the connection zone, the connector housing, or both and the polymeric frame between −40° C. and 85° C.; the at least one elastomeric barrier element comprises a polyisobutylene tape; the at least one elastomeric barrier element selected from the group consisting of silicone, polychloroprene, butadiene/acrylonitrile copolymer, EPDM rubber, polyurethane, and polyisobutylene.

Accordingly, pursuant to another aspect of the present invention, there is contemplated a method of positioning electrical connectors and seals relative to each other (to prevent water ingress to electrics and/or discontinuity) between at least two photovoltaic devices as assembled to a structure with a connector in-between, including at least the steps of: providing a first photovoltaic device, the device including at least one locating feature; providing a second photovoltaic device, the device including at least one locating feature;

installing the first device to the structure; connecting the first and second device together via the connector; providing a removable secondary device, the secondary device including at least two mating features; aligning at least one mating feature to at least one locating feature; adjusting the location of the second device so that the second of two mating features are aligned with the second locating feature; and installing the second device to the structure.

Accordingly, pursuant to another aspect of the present invention, there is contemplated a photovoltaic device comprising: a polymeric frame; and a multi-layered multi-layer laminate structure that includes a connector and electronic circuit assembly; wherein the connector and electronic circuit assembly is at least partially encased in a polymeric frame and comprises: a connector assembly comprising: a connector housing; at least one electrical connector protruding from the housing; an electronic circuit component comprising: at least one bus bar; and a connection zone where the at least one electrical connector and the at least one bus bar are joined; wherein the connection zone, the connector housing, or both including at least one elastomeric barrier element. Optionally, it is also contemplated that any combination of features described in the preceding paragraphs may be combined with this photovoltaic device.

It should be appreciated that the above referenced aspects and examples are non-limiting, as others exist within the present invention, as shown and described herein.

DETAILED DESCRIPTION OF THE PREFERRED EMBODIMENT

Figure 1:
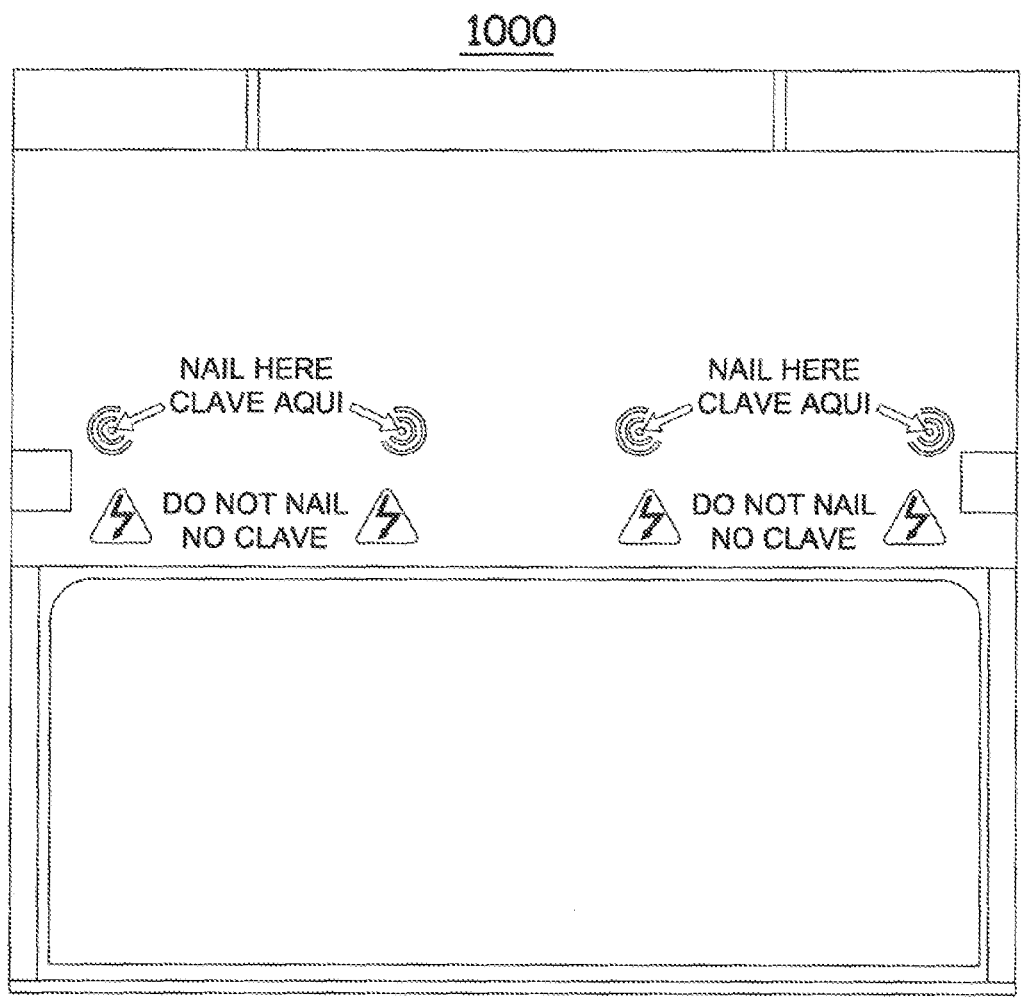
FIG. 1 is a plan view of an illustrative example of a PV ice according to the present invention.

The present invention is directed to an improved connector and electronic circuit assembly that is at least partially encased in a polymeric frame. Of particular interest in this application is an improved connector and electronic circuit assembly that is part of a photovoltaic device ("PV device"), for example as described in PCT Patent Application No. PCT/US2009/042523. The photovoltaic device 1000, for the purposes of the present invention, can be generally defined as being constructed of a multi-layer laminate structure that is at least partially encased in a polymeric frame 200 (e.g. via an over-molding process), for example as shown in FIG. 1. The improved connector and electronic circuit assembly 130 is electrically connected to the PV layer 30. It may be convenient to assemble these components as part of the multi-layer laminate structure 100. The respective components of the device 1000 are further described below.

Multi-Layer Laminate Structure 100

Figure 2:
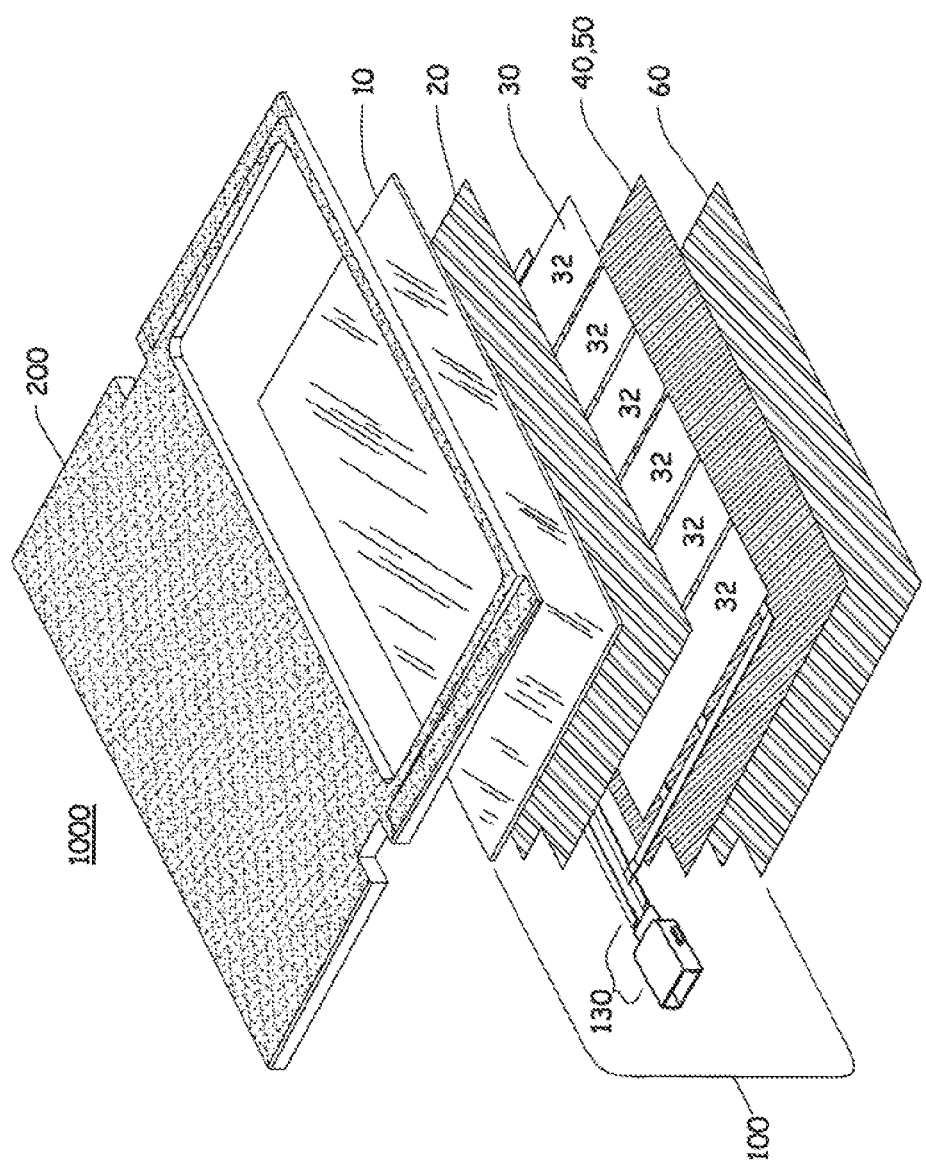
FIG. 2 is an exploded view of FIG. 1

It is contemplated that the multi-layer laminate structure 100, for example as shown in FIG. 2, may include a plurality of individual layers (e.g. first layer, second layer, third layer, or more) which are at least partially bonded together to form the multi-layer laminate structure 100. It is also contemplated that in the assembled multi-layer laminate structure 100, that any given layer may at least partially interact/interface with more than just its adjacent layer (e.g. first layer may interact/interface at least partially with the third layer).

Each individual layer may be defined as having a height, length and width, and thus a volume. Each layer may also have a profile that is consistent along its height, length or width or may be variable therein. Each layer may have top, bottom, and interposed side surfaces. Each individual layer may be monolithic in nature or may itself be a multi-layer construction or an assembly of constituent components. In a preferred embodiment, at least some of the layers have a thickness that of at least about 0.001 mm, preferably at least about 0.1 mm, and depending upon the layer at least about 2.0 mm or more, (but preferably not more that about 1.5 mm).

Various layer construction/compositions embodiments are discussed below. It should be appreciated that any layer of the multi-layer laminate structure 100 may contain any or none of the materials or assemblies. In other words, any particular layer embodiment may be part of any of the layers of the multi-layer laminate structure 100.

In a preferred embodiment, one or more of the layers may function as an environmental shield ("shield layer"), e.g. layer 10, for the multi-layer laminate structure 100 generally, and more particularly as an environmental shield for the successive layers. This layer is preferably constructed of a transparent or translucent material that allows light energy to pass through to at least one underlying layer. This material may be flexible (e.g. a thin polymeric film, a multi-layer film, glass, or glass composite) or be rigid (e.g. a thick glass or Plexiglas™ such as polycarbonate). The material may also be characterized by being resistant to moisture/particle penetration or build up. The first layer may also function to filter certain wavelengths of light such that preferred wavelengths may readily reach the opposite side of that layer, e.g. photovoltaic cells below the shield layer. In a preferred embodiment, the first layer material will also range in thickness from about 0.05 mm to 10.0 mm, more preferably from about 0.1 mm to 4.0 mm, and most preferably from 0.2 mm to 0.8 mm. Other physical characteristics, at least in the case of a film, may include: a tensile strength of greater than 20 MPa (as measured by JIS K7127: JSA JIS K 7127 Testing Method for Tensile Properties of Plastic Films and Sheets published in 1989); tensile elongation of 1% or greater (as measured by JIS K7127); and water absorption (23° C., 24 hours) of 0.05% or less (as measured per ASTM 0570-98 (2005)).

In a preferred embodiment, one or more of the layers may serve as a bonding mechanism (bonding layers 20 and 40), helping hold some or all of any adjacent layers together. In some case (although not always), it should also allow the transmission of a desirous amount and type of light energy to reach adjacent layers. The bonding layer may also function to compensate for irregularities in geometry of the adjoining layers or translated though those layers (e.g. thickness changes). It also may serve to allow flexure and movement between layers due to temperature change and physical movement and bending. In a preferred embodiment, the bonding layer may consist essentially of an adhesive film or mesh, preferably an olefin (especially functionalized olefins such as silane grafted olefins), EVA (ethylene-vinyl-acetate), silicone, PVB (poly-vinyl-butyral) or similar material. The preferred thickness of this layer range from about 0.1 mm to 1.0 mm, more preferably from about 0.2 mm to 0.8 mm, and most preferably from about 0.25 mm to 0.5 mm.

In a preferred embodiment, one or more of the layers may also serve as an environmental protection layer (back sheet layers 50), for example to keep out moisture and/or particulate matter from the layers above (or below if there are additional layers). It is preferably constructed of a flexible material (e.g. a thin polymeric film, a metal foil, a multi-layer film, or a rubber sheet). In a preferred embodiment, the back sheet material may be moisture impermeable and also range in thickness from about 0.05 mm to 10.0 mm, more preferably from about 0.1 mm to 4.0 mm, and most preferably from about 0.2 mm to 0.8 mm. Other physical characteristics may include: elongation at break of about 20% or greater (as measured by ASTM D882-09); tensile strength or about 25 MPa or greater as measured by ASTM 0882-09); and tear strength of about 70 kN/m or greater (as measured with the Graves Method). Examples of preferred materials include glass plate, PET, aluminum foil, Tedlar® (a trademark of DuPont) or a combination thereof.

In a preferred embodiment, one or more of the layers may act as an additional barrier layer (supplemental barrier layer 60), protecting the adjoining layers above from environmental conditions and from physical damage that may be caused by any features of the structure on which the multi-layer laminate structure 100 is subjected to (e.g. for example, irregularities in a roof deck, protruding objects or the like). It is also contemplated that a supplemental barrier layer could provide other functions, such as thermal barriers, thermal conductors, adhesive function, etc. It is contemplated that this is an optional layer and may not be required. The supplemental barrier sheet may be a single material or a combination of several materials, for example, it may include a scrim or reinforcing material. In a preferred embodiment, the supplemental barrier sheet material may be at least partially moisture impermeable and also range in thickness from about 0.25 mm to 10.0 mm, more preferably from about 0.5 mm to 2.0 mm, and most preferably from 0.8 mm to 1.2 mm. It is preferred that this layer exhibit elongation at break of about 20% or greater (as measured by ASTM 0882-09); tensile strength or about 10 MPa or greater (as measured by ASTM D882-09); and tear strength of about 35 kN/m or greater (as measured with the Graves Method). Examples of preferred materials of which the barrier layer could be comprised include thermoplastic polyolef in ("TPO"), thermoplastic elastomer, olefin block copolymers ("OBC"), natural rubbers, synthetic rubbers, polyvinyl chloride, and other elastomeric and plastemeric materials. Alternately the protective layer could be comprised of more rigid materials so as to provide additional structural and environmental protection. Additional rigidity may also be desirable so as to improve the coefficient of thermal expansion of the multi-layer laminate structure 100 and maintain the desired dimensions during temperature fluctuations. Examples of protective layer materials for structural properties include polymeric materials such polyolefins, polyester amides, polysulfone, acetel, acrylic, polyvinyl chloride, nylon, polycarbonate, phenolic, polyetheretherketone, polyethylene terephthalate, epoxies, including glass and mineral filled composites or any combination thereof.

In a preferred embodiment, one or more of the layers (PV layer 30) may be constructed of any number of photovoltaic cells or connected cell assemblies, which may be commercially available today or may be selected from some future developed photovoltaic cells. According to one embodiment, it is contemplated that the improved connector and electronic circuit assembly 130 is part of this layer of the multi-laminate structure 100 and is further described in a following sections of this disclosure.

Generally, these photovoltaic cells or cell assemblies function to convert light energy into electrical energy and transfer the energy to and from the device 1000 via assembly 130. The photoactive portion of the photovoltaic cell 32 is the material which converts light energy to electrical energy. Any material known to provide that function may be used including crystalline silicon, amorphous silicon, CdTe, GaAs, dye-sensitized solar cells (so-called Gratezel cells), organic/polymer solar cells, or any other material that converts sunlight into electricity via the photoelectric effect. However, the photoactive layer is preferably a layer of IB-IIIA-chalcogenide, such as IB-IIIA-selenides, IB-IIIA-sulfides, or IB-IIIA-selenide sulfides. More specific examples include copper indium selenides, copper indium gallium selenides, copper gallium selenides, copper indium sulfides, copper indium gallium sulfides, copper gallium selenides, copper indium sulfide selenides, copper gallium sulfide selenides, and copper indium gallium sulfide selenides (all of which are referred to herein as CIGSS). These can also be represented by the formula $CuIn(1-x)GaxSe(2-y)Sy$ where x is 0 to 1 and y is 0 to 2. The copper indium selenides and copper indium gallium selenides are preferred. Additional electroactive layers such as one or more of emitter (buffer) layers, conductive layers (e.g. transparent conductive layers) and the like as is known in the art to be useful in CIGSS based cells are also contemplated herein. These cells may be flexible or rigid and come in a variety of shapes and sizes, but generally are fragile and subject to environmental degradation. In a preferred embodiment, the photovoltaic cell assembly is a cell that can bend without substantial cracking and/or without significant loss of functionality. Exemplary photovoltaic cells are taught and described in a number of patents and publications, including US3767471, US4465575, US20050011550 A1, EP841706 A2, US20070256734 A1, EP 1032051,42, JP2216874, JP2143468, and JP10189924A, incorporated hereto by reference for all purposes.

Polymeric Frame 200

It is contemplated that the polymeric frame 200 may be a compilation of components/assemblies, but is preferably generally a polymeric article that is formed by injecting a polymer (or polymer blend) into a mold (with or without inserts such as the multi-layer laminate structure 100 or the other component(s), for example as disclosed in currently pending International patent application No. PCT/US09/042496, incorporated herein by reference. The polymeric frame 200 functions as the main structural carrier for the PV device 1000 and should be constructed in a manner consistent with this. For example, it can essentially function as a plastic framing material.

It is contemplated that the compositions that make up the polymeric frame 200 also exhibit a coefficient of linear expansion ("CLTE") of about 0.5×10-6 mm/mm° C. to about 140×10-6 mm/mm° C., preferably of about 3×10-6 mm/mm° C. to about 50×10-6 mm/mm° C., more preferably from about 5×10-6 mm/mm° C. to about 30×10-6 mm/mm° C., and most preferably from about 7×10-6 mm/mm° C. to about 25×10-6 mm/mm° C. Most desirably, the CLTE of the composition that makes up the polymeric frame 200 should closely match the CLTE of the layer 10 (or in some cases of the entire structure 100). Preferably the CLTE of the composition making up the polymeric frame 200 disclosed herein are also characterized by a coefficient of linear thermal expansion (CLTE) is within factor of 20, more preferably within a factor of 15, still more preferably within a factor of 10, even more preferably within a factor of 5, and most preferably within a factor of 2 of the CLTE of the layer 10 (or structure 100). For example, if layer 10 has a CLTE of 9×10-6 mm/mm° C., then the CLTE of the molding composition is preferably between 180×10-6 mm/mm° C. and 045×10-6 mm/mm° C. (a factor of 20); more preferably between 135×10-6 mm/mm° C. and 0.6×10-6 mm/mm° C. (a factor of 15); still more preferably between 90×10-6 mm/mm° C. and 0.9×10-6 mm/mm° C. (a factor of 10); even more preferably between 45×10-6 mm/mm° C. and 1.8×10-6 mm/mm° C. (a factor of 5) and most preferably between 18×10-6 mm/mm° C. and 4.5×10-6 mm/mm° C. (a factor of 2).

For some embodiments of the photovoltaic articles disclosed herein, assembly 100 includes a glass barrier layer. If assembly 100 includes a glass layer, the CLTE of the molding composition is preferably less than 80×10-6 mm/mm° C., more preferably less than 70×10-6 min/mm° C., still more preferably less than 50×10-6 mm/mm° C., and most preferably less than 30×10-6 mm/mm° C. Preferably, the CLTE of the novel composition is greater than 5×10-6 mm/mm° C.

In a preferred embodiment, the frame 200 may comprise (be substantially constructed from) a body material. This body material may be a filled or unfilled moldable plastic (e.g. polyolefins, acrylonitrile butadiene styrene (SAN), hydrogenated styrene butadiene rubbers, polyester amides, polyether imide, polysulfone, acetel, acrylic, polyvinyl chloride, nylon, polyethylene terephthalate, polycarbonate, thermoplastic and thermoset polyurethanes, synthetic and natural rubbers, epoxies, SAN, Acrylic, polystyrene, or any combination thereof). Fillers (preferably up to about 50% by weight) may include one or more of the following: colorants, fire retardant (FR) or ignition resistant (IR) materials, reinforcing materials, such as glass or mineral fibers, surface modifiers. Plastic may also include anti-oxidants, release agents, blowing agents, and other common plastic additives. In a preferred embodiment, glass fiber filler is used. The glass fiber preferably has a fiber length (after molding) ranging from about 0.1 mm to about 2.5 mm with an average glass length ranging from about 0.7 mm to 1.2 mm.

In a preferred embodiment, the body material (composition(s)) has a melt flow rate of at least 5 g/10 minutes, more preferably at least 10 g/10 minutes. The melt flow rate is preferably less than 100 g/10 minutes, more preferably less than 50 g/10 minutes and most preferably less than 30 g/10 minutes. The melt flow rate of compositions were determined by test method ASTM D1238-04, "REV C Standard Test Method for Melt Flow Rates of Thermoplastics by Extrusion Plastometer", 2004 Condition L (230° C./2.16 Kg). Polypropylene resins used in this application also use this same test method and condition. The melt flow rate of polyethylene and ethylene-□-olefin copolymers in this invention are measured using Condition E (190° C./2.16 Kg), commonly referred to as the melt index.

In all embodiments, the compositions have flexural modulus of at least 500 MPa, more preferably at least 600 MPa and most preferably at least 700 MPa. According to the preferred embodiment where the multi-layer laminate structure 100 includes a glass layer, the flexural modulus is preferably at least 1000 and no greater than 7000 MPa. According to the second embodiment, the flexural modulus is no greater than 1500 MPa, more preferably no greater than 1200 MPa, most preferably no greater than 1000 MPa. The flexural modulus of compositions were determined by test method ASTM D790-07 (2007) using a test speed of 2 mm/mm. It is contemplated that the compositions that make up the polymeric frame 200 also exhibit a coefficient of linear expansion ("body CLTE") of about 25×10-6 mm/mm° C. to 70×10-6 mm/mint, more preferably of about 27×10-6 mm/mm° C. to 60×10-6 mm/mm° C., and most preferably from about 30×10-6 mm/mm° C. to 40×10-6 mm/mm° C.

It is contemplated that the frame 200 may also be characterized as exhibiting a Young's Modulus @−40 C=7600 MPa+/−20%; @ 23 C=4200 MPa+/−20%; and @ 85 C=2100 MPa+/−20%.

The compositions useful herein is characterized as having both an RTI Electrical and an RTI Mechanical Strength rating, each of which is at least 85° C., preferably at least 90° C., more preferably at least 95° C., still more preferably at least 100° C., and most preferably at least 105° C. Preferably, the novel compositions are characterized as having an RTI Electrical and an RTI Mechanical Strength, each of which is at least 85° C., preferably at least 90° C., more preferably at least 95° C., still more preferably at least 100° C., and most preferably at least 105° C. Most preferably, these compositions are characterized as having an RTI Electrical, an RTI Mechanical Strength, and an RTI Mechanical Impact rating, each of which is at least 85 (° C., preferably at least 90° C., more preferably at least 95° C., still more preferably at least 100° C., and most preferably at least 105° C.

RTI Relative Thermal Index) is determined by the test procedure detailed in UL 7468 (Nov. 29, 2000). Essentially a key characteristic of the plastic is measured at the start of the test (for instance tensile strength), and then samples placed in at least four elevated temperatures (e.g. 130, 140, 150, 160 deg C.) and samples periodically tested throughout several months; The reductions in key properties are then tested, and working criteria established from comparison results of known materials of proven field service; The effective lifetime of the unknown sample is then determined compared to the known material. All is expressed in degrees C. The test takes a minimum of 5000 hours to complete, and can be both time-consuming and costly.

Because RTI is an expensive and time-consuming test, a useful proxy for guiding the skilled artisan in selecting useful compositions is the melting point, as determined by differential scanning calorimetry (DSC). It is preferred that for the compositions set forth as useful herein, no melting point is seen at temperatures less than 160° C. in differential scanning calorimetry for a significant portion of the composition and preferably no melting point is seen under 160° C. for the entire composition. The Differential Scanning calorimetry profiles were determined by test method ASTM D7426-08 (2008) with a heating rate of 10° C./mm. If a significant fraction of the injection molding composition melts at temperatures below 160° C., it is unlikely that the composition will pass the UL ATI tests 7468 for Electrical, Mechanical Strength, Flammability, and Mechanical Impact with a high enough rating to adequately function when used in the PV device 1000.

It is contemplated that the polymeric frame 200 may be any number of shapes and sizes. For example, it may be square, rectangular, triangular, oval, circular or any combination thereof.

Connector and Electronic Circuit Assembly 130

Figure 3:
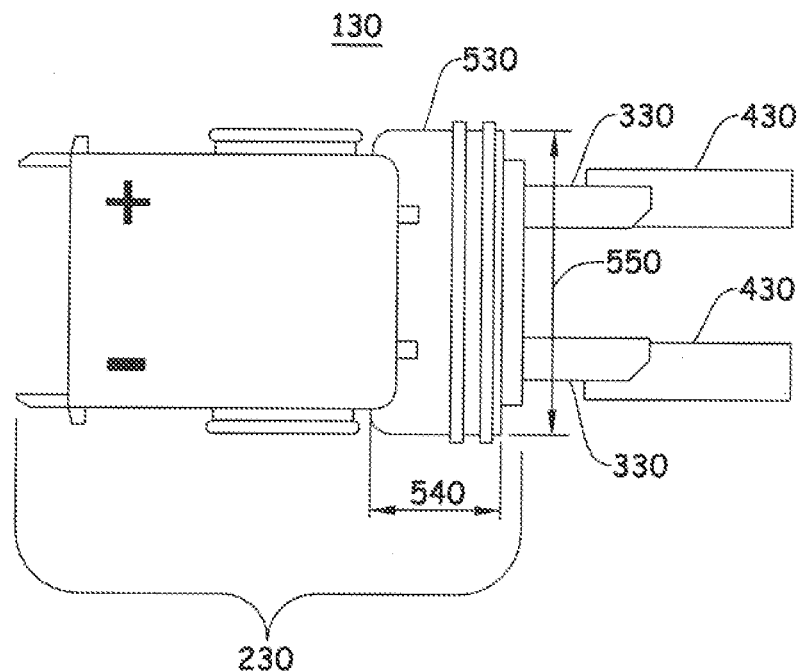
FIG. 3 is a plan view of one illustrative example of an improved connector and electronic circuit assembly according to the present invention.

According to a first embodiment, it is contemplated that an improved connector and electronic circuit assembly 130 may be used to overcome one or more of the issues described in this disclosure. Functionally, the assembly 130 performs as the conduit/bridge for electricity to move to and from the device 1000. It is contemplated that the assembly 130 may be comprised of at least four major components; a connector housing 230; at least one electrical connector 330; at least one electronic circuit component 430; and at least one barrier element 530, for example as shown in FIG. 3. Each component will be further described in the following paragraphs.

Generally, the materials contemplated for each of the components described below are appropriate for the given functions. For example, the housings and elements described forthwith preferably are comprised of somewhat rigid materials that will hold up to the conditions of use. The use of plastics (thermoplastics and thermosets), metals, ceramics, and composites are contemplated. Not surprisingly, the housings and elements structures will preferably be constructed of electrically non-conductive materials and the electrical members and terminals of electrically conductive materials. Preferred non-conductive materials may be organic or inorganic materials. Examples of preferred polymeric materials include thermoplastic and thermosetting materials such as, for example, filled or unfilled olefins; styrenics, polypropylene, polycarbonate, acrylonitrile butadiene styrene, polybutylene terephthalate, polyphenylene oxide, polyphenylene ether, polyphthalamide, polyphenylene sulfide polyamide, polyarylamide, polymeric elastomers, natural or synthetic rubber, ceramic; or any combination thereof. Preferred conductive materials include plated or un-plated metals (e.g. silver, tin, steel, gold, aluminum; copper, brass, or any combination thereof) and/or conductive polymers.

Figure 4:
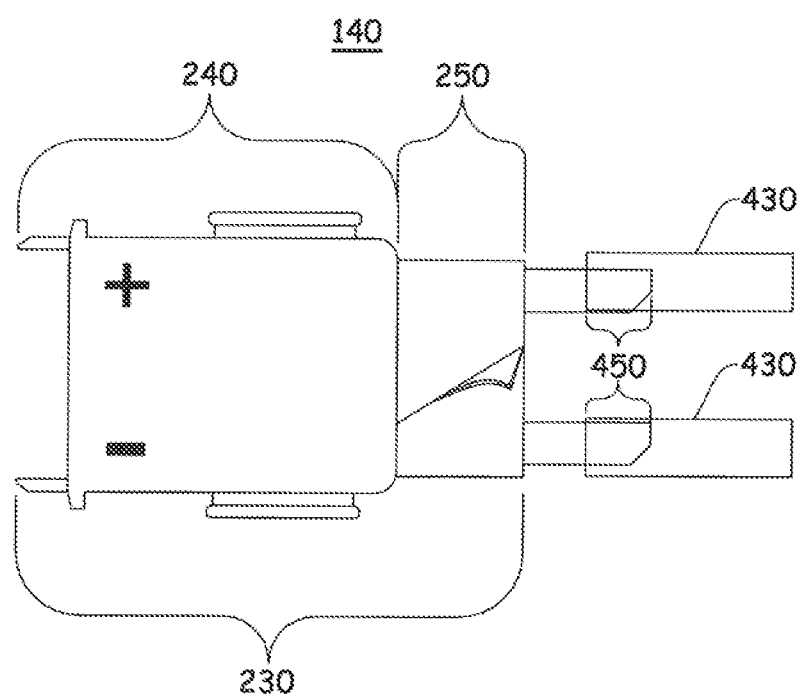
FIG. 4 is a plan view of one illustrative example of an improved connector and electronic circuit assembly according to the present invention without a barrier element.

The connector housing 230 functions to house one end of the at least one electrical connector 330 and serves as a mating structure for external connectors (not shown) which can interconnect the PV device 1000 to any number of external devices (e.g. other PV devices, an inverter, edge connector devices, etc.). The housing 230 generally comprises a main body portion 240 and a protruding neck portion 250, for example as illustrated in FIG. 4.

It is contemplated that within the assembled PV device 1000, the main body portion 240 is at least partially encapsulated by the frame 200 and the neck portion 250 is substantially encapsulated (e.g. at least about 90% of its surface area) or fully encapsulated by the frame 200. The main body portion preferably having a thickness $T_{CB}$ of between about 7.0 and 15.0 mm, more preferably between about 9.0 and 12.5 mm. It is also contemplated that the neck portion is generally at least about 1.5 mm to about 4.0 mm thinner than the main body portion 240.

Figure 7:
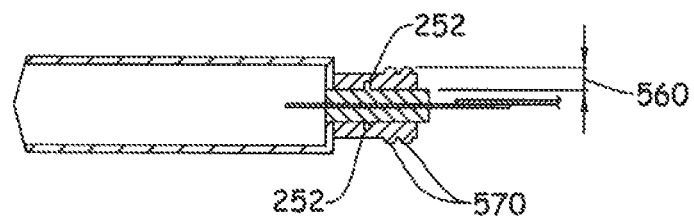
FIG. 7 is a sectional side view of one illustrative example of an improved connector and electronic circuit assembly according to the present invention.

In illustrative one embodiment, as illustrated in FIG. 7, the neck portion 250 includes an optional neck rib 252. It is contemplated that the neck rib 252 may function as a locating means and/or a retention aid for the at least one barrier element 530. In the illustrative embodiment, the rib 252 may be located about 50% of the distance away from the main body portion 240. This neck rib 252 also may project in an approximately perpendicular direction to the surface of the neck at a distance of about 1.0 mm. It is contemplated that the size of the neck rib 252 may be as much as two or three times that of this illustrative example and that it may be positioned anywhere on the neck portion 250.

The at least one electrical connector 330 functions to conduct electricity through the connector housing 230. As shown in FIG. 4 (in this illustration showing two electrical connectors), the connector 330 protrudes from the neck portion 250 of the housing 230 and overlaps (and functionally electrically connected thereto) the electronic circuit component 430 (again two shown) at a connection zone 450. It is contemplated that the connection zone 450 could be a single point or a span ranging from a few millimeters to a few centimeters. The electrical connection between the connector and the circuit may be facilitated by any known technique, for example: welding; soldering; or use of conductive adhesives.

The at least one electronic circuit component 430 may function as a bridge from the photovoltaic cells 32 to the electrical connector 330 and/or to any other electrical components within the device 1000. It is contemplated that the circuit 430 may generally comprise what is known in the industry as a bus bar.

The at least one barrier element 530 may function to aid in the isolation of the electrical connector 330 and/or electronic circuit component 430 from outside environmental contaminants (e.g. air, water, dust and dirt, etc.) after the multilayered laminate 100 is combined with the frame 200. Of particular interest is the function of the barrier element 530 to perform this function in the situation where there is a separation between the outside surface of the frame 200 and the connector housing 230 (e.g. due to mechanical or environmental stresses).

The at least one barrier element 530 may be further defined as having a length 540, a width 550, and a thickness 560. The element 530 is generally is positioned about (encircling) a portion of the connector neck portion 250, it is contemplated that it may extend such that it is also positioned about a portion of electrical connector 330 and potentially into at least a portion of the connection zone 450.

Figure 6:
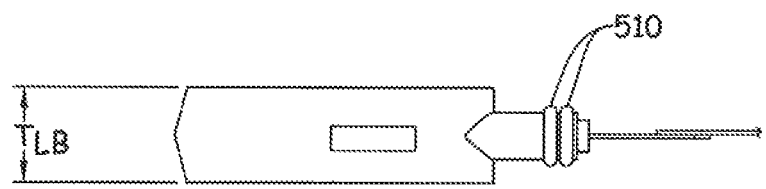
FIG. 6 is a side view of one illustrative example of an improved connector and electronic circuit assembly according to the present invention.

The barrier element 530 may have a generally flat cross sectional profile (e.g. FIG. 8) or may include one or more rib structures 570 (e.g. FIGS. 6 and 7). It is contemplated that the rib structure may enhance the isolation functionality of the barrier element. It is contemplated that the rib structure may be anywhere from about 0.5 to 2.5 mm in height.

Figure 8:
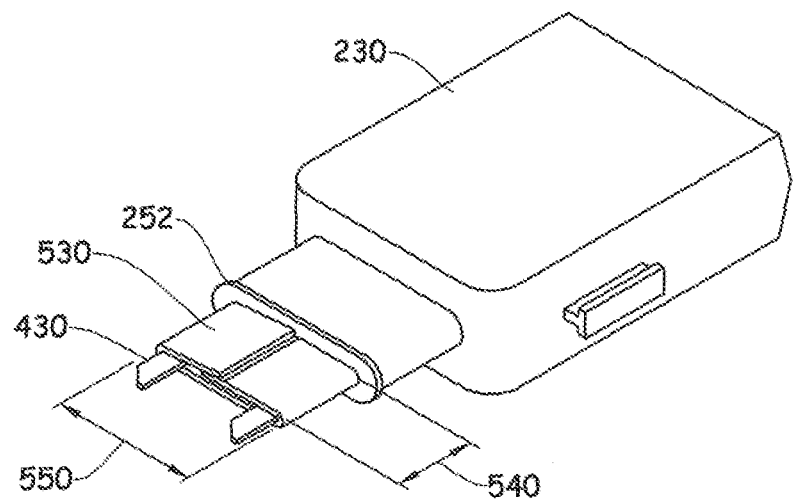
FIG. 8 is a perspective view of another illustrative example of an improved connector and electronic circuit assembly according to the present invention.

In a preferred embodiment, the barrier element may comprise an elastomeric material such as silicone, polychloroprene, butadiene/acrylonitrile copolymer. EPDM rubber, polyurethane, polyisobutylene, or any combination thereof. Generally, it is preferred that the material have a hardness of between about 10 to 150 Shore A Durometer per ASTM D2240 00, more preferably between about 15 to 120, most preferably between about 20 and 100. One example of a commercially available barrier material is HelioSeal™ PSIS 101 butyl tape from ADCO as shown in FIG. 8.

In one preferred embodiment, the material of the barrier element is selected such that it functions to create an adhesive joint between the connection zone, the connector housing, or both and the polymeric frame. Preferably this joint maintains its adhesive nature at least between about −40° C. and 85° C., more preferably −50° C. and 100° C. Preferably the joint can maintain a seal and thus isolating the electrical components from outside environmental contaminants during and after the tests described earlier in this disclosure.

In relation to the material properties of the frame 200, in another preferred embodiment, the barrier element material has an Young's modulus such that a modulus ratio of the frame material to the modulus to the barrier element material at 23° C. is at least about 500:1, the modulus ratio at −40° C. is at least about 50:1, and the modulus ratio at 85° C. is at least about 10000:1. It is contemplated that these above stated ratio values could be about 25 to 50% lower or higher than stated and still maintain the desired functionality. For example, the barrier element material has an Young's modulus such that a modulus ratio of the frame material to the modulus to the barrier element material at 23° C. is at least about 250:1, the modulus ratio at −4° C. is at least about 25:1, and the modulus ratio at 85° C. is at least about 5000:1. The most preferred ratios are about 120:1 @−40° C.; 2400:1 @ 23° C.; and 14000:1 @35° C. In an alternative embodiment, the barrier element material has an Young's modulus such that a modulus ratio of the frame material to the modulus to the barrier element material at 23° C. is at least about 250:1, the modulus ratio at −4° C. is at least about 10:1, and the modulus ratio at 85° C. is at least about 500:1 and the most preferred ratios are about 15:1 @−40° C.; 400:1 @ 23° C.; and 1000:1 @ 85° C.

EXAMPLES

Figure 5:
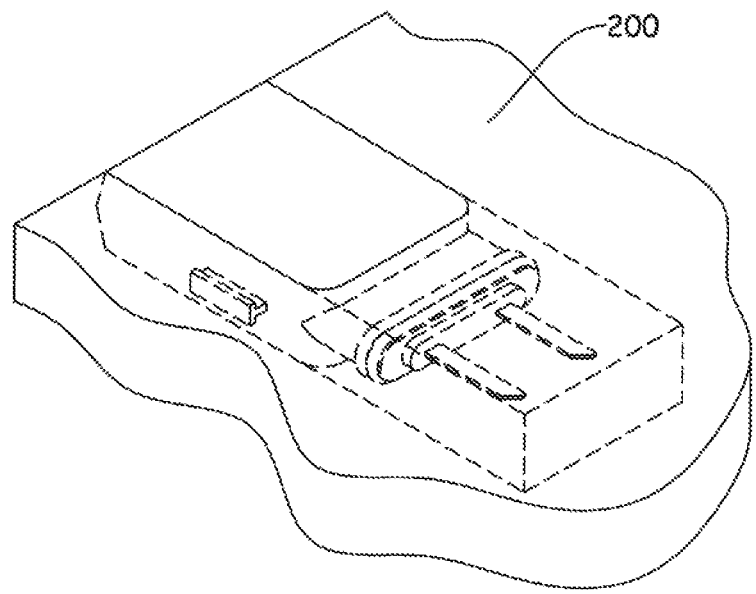
FIG. 5 is a perspective view of one illustrative example of an improved connector and electronic circuit assembly according to the present invention.

In a first illustrative example, as shown in FIGS. 3 and 5-7, a barrier element 530 that is disposed solely on the neck portion 250 is disclosed, in this example the barrier element 530 encompasses the neck portion 250 and covers about 60% of the length thereof and also abuts the main body 240. It includes two rib structures 570 that protrude about 0.5 mm from the surface. As shown in FIG. 5, the frame 200 covers the barrier element 530 and has a minimum thickness of about 1.5 mm above the ribs 570. In this example, the barrier element 530 maintains at least a minimum compression value of about 5% to 30% when encased in the polymeric frame 200.

In a second illustrative example, as shown in FIG. 8, a barrier element 530 that is disposed on a portion of the neck portion 250, the electrical connector 330 and into at least a portion of the connection zone 450. In this example, the barrier element 530 comprises a strip of polyisobutylene (e.g. a butyl tape that is 44.5 mm long×12 mm wide×0.9 mm thick. The material is wrapped around the connector as for example as shown in FIG. 8). The length dimension is overlapped by about 3-10 mm) that has been wrapped about 1.5 times around the components and abuts the rib 252. The strip in this example, the barrier element is configured to maintain an adhesive joint between the connection zone, the connector housing, or both and the polymeric frame between about −40° C. and 85° C. It is also contemplated, but not shown, that this type of barrier element 530 may be in the form or a paste. One example of a "paste" may be to use the HelioSeal™ PVS 101 butyl applied at higher temperature (e.g. via a heated caulk gun), as opposed to a room temperature tape application.

Figure 9:
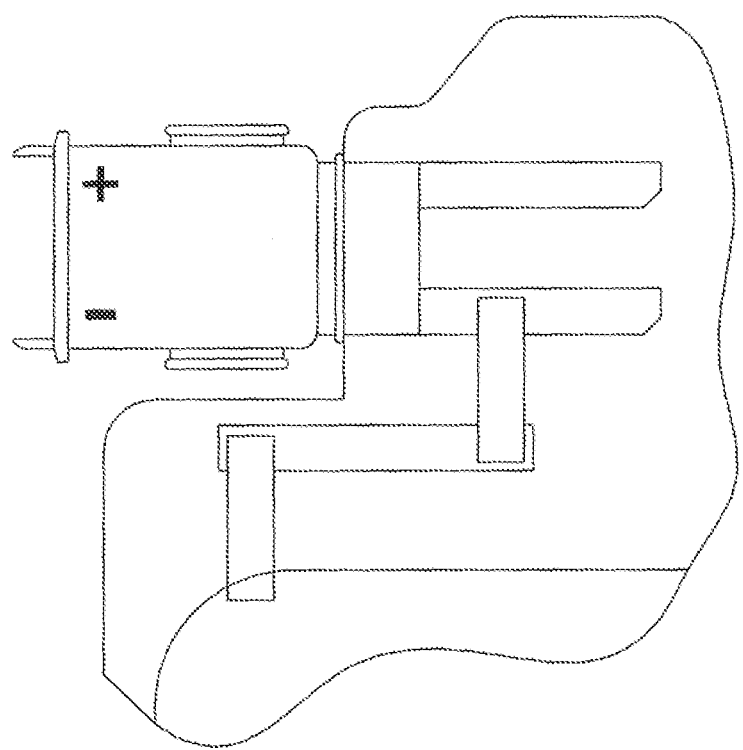
FIG. 9 is a plan view of yet another illustrative example of an improved connector and electronic circuit assembly according to the present invention.
Figure 10:
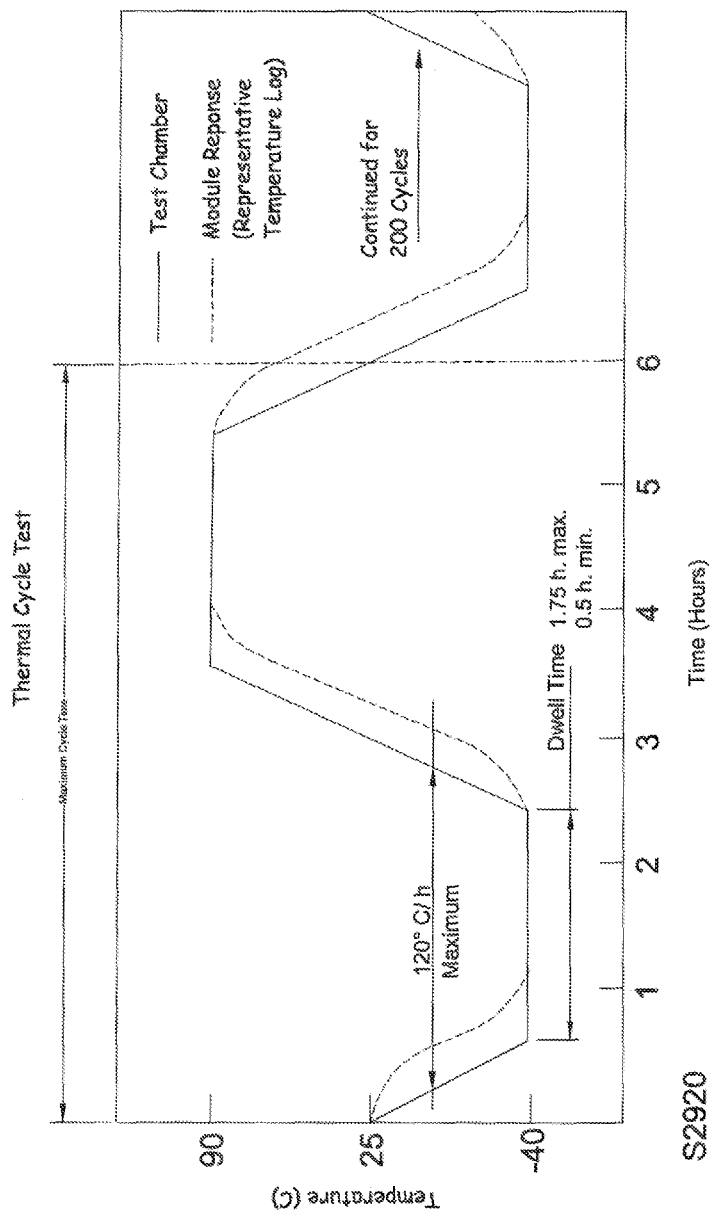
FIG. 10 is a graphical representation of a thermal cycle test according to the present invention.

In a third illustrative example, as shown in FIG. 9, a barrier element comprises a coating applied to the connector 330 and the electrical circuit 430. This coating is applied after the connector 330 and the circuit 430 has been joined at the connection zone 450 (e.g. via welding, soldering, or conductive adhesive). It is contemplated that this coating should be applied post joining so that a positive electrical connection can be created.

Locators

In another aspect of the present invention, it is believed that another potential failure mode in meeting the requirements discussed in this application may be related to the installation of at least two photovoltaic devices 1000 with at least one electrical connector 330 therebetween onto a building structure. It is believed that improper installation and/or the specific design of the photovoltaic devices 1000 can influence any occurrences of potential long term performance issues.

It is contemplated that this may be solved with the use of a removable secondary device 1100 that locates and/or that locates and compensates for temperature related expansion during installation. One example of such a solution discussed in further detail below and in FIGS. 11-14.

Figure 11:
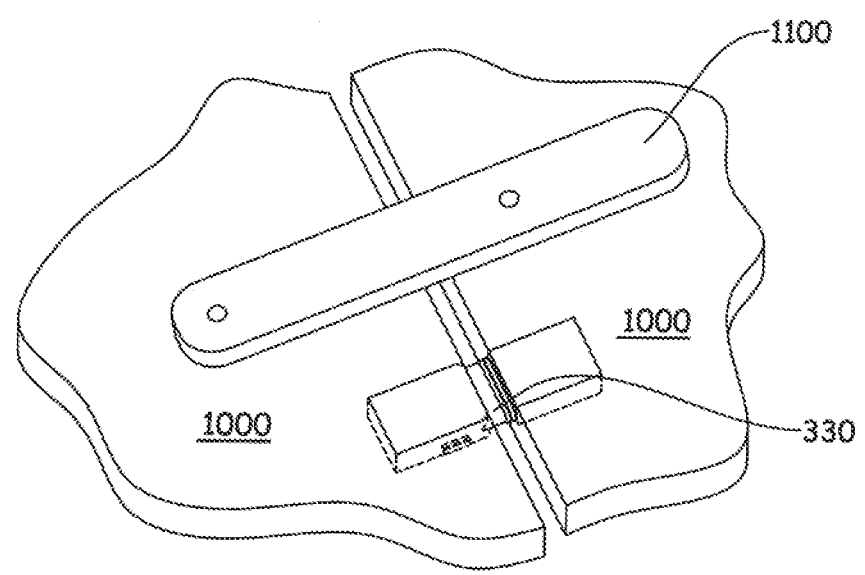
FIG. 11 is top perspective view of one illustrative example of a removable secondary device on two PV devices.
Figure 12:
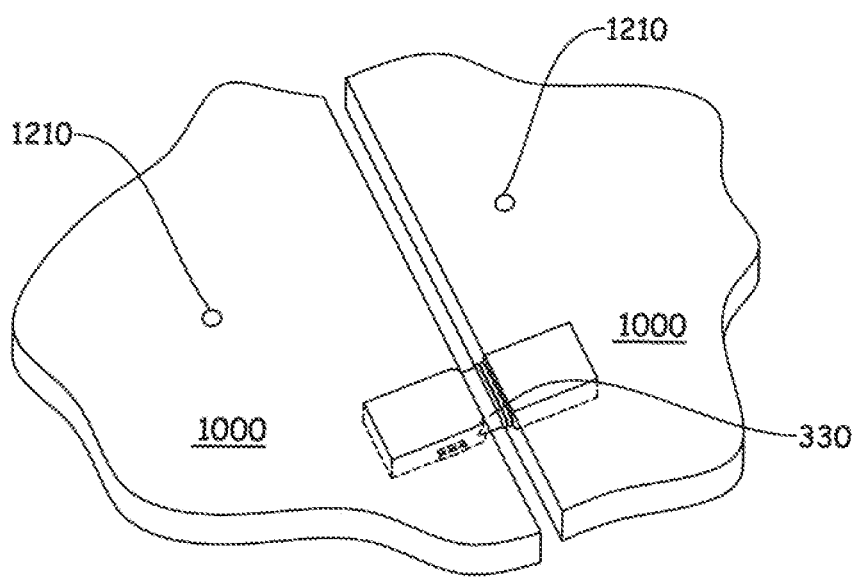
FIG. 12 is top perspective view of one illustrative example of locating features on two PV devices
Figure 13:
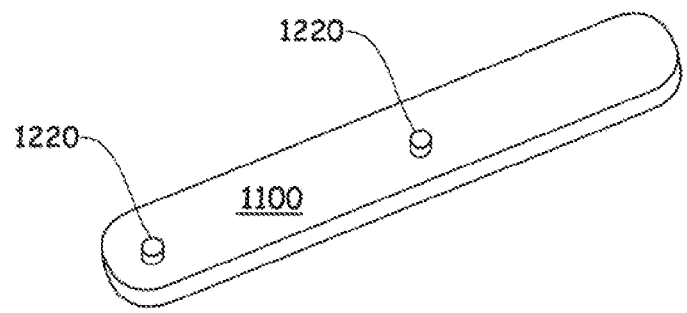
FIG. 13 is bottom perspective view of one illustrative example of a removable secondary device

It is contemplated that a removable secondary device 1100 may interlock into locating features 1210 on adjacent photovoltaic devices 1000 such that it limits component separation during installation. It is contemplated that these features 1210 may be projections or recessions on the photovoltaic devices 1000, with mating features 1220 on the device 1100. It is also contemplated that these may be specifically for this purpose or used for other functions, such as nailing or screwing. Illustrative examples are shown in FIGS. 11-13. It is contemplated that the removable secondary device 1100 may be constructed from a number of materials with certain characteristics, such as abrasion resistance, rigidity (modulus or elasticity), and low coefficient of thermal expansion. Exemplary materials include: metals, ceramics, and engineering plastics (such as nylon, polycarbonate, polypropylene, ABS, etc).

While this removable secondary device 1100 may be based on locations very near the connection point, they may be located off any edge of the device. For example, combinations based on the locator points shown in FIG. 14 may be used. Combinations may be chosen from a-a, b-b, c-c, d-d, e-e, etc. Other combinations may be desirable for certain installation sequences or fixture lengths: b1-b2, b1-c2. For angularity verification, combinations such as from e1 to a2 or c1 to a2 may be chosen.

Figure 14:
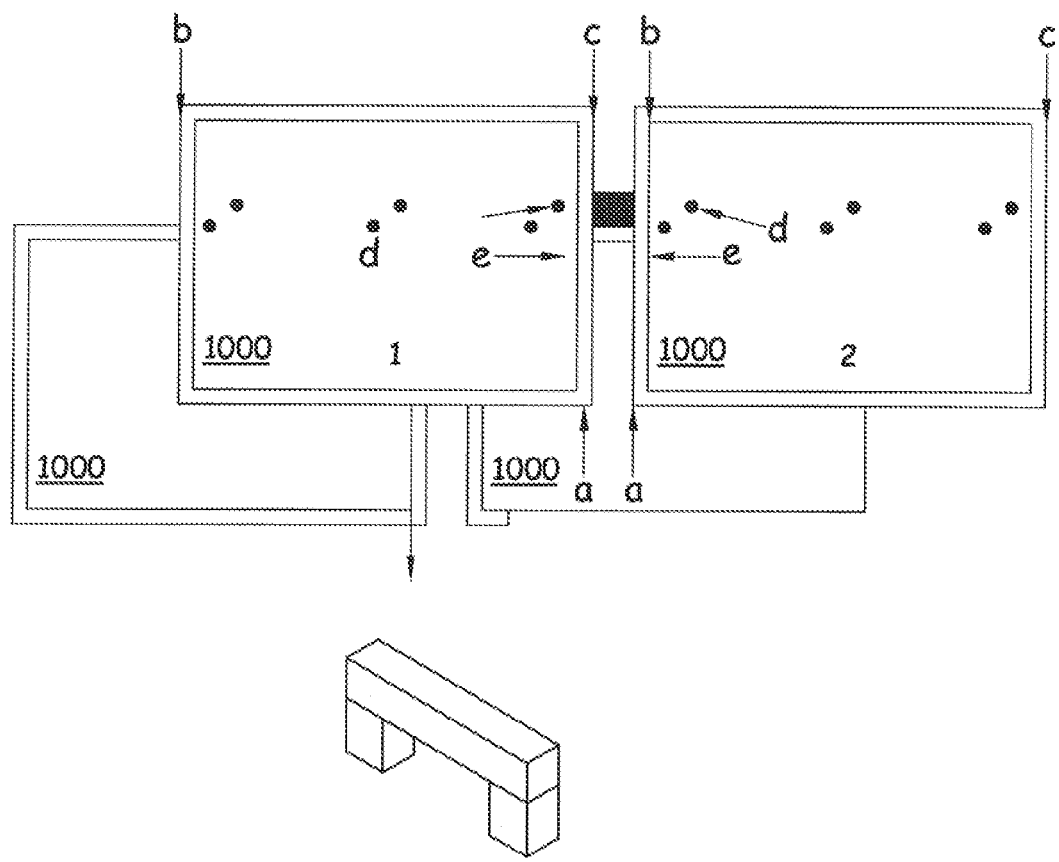
FIG. 14 is plan view (schematic) illustrative examples of locations for locating features.

The locating device may be designed for desired tolerances in locating of one device relative to another while allowing for variations in position and environmental conditions. Such locator characteristics as size with respect to the photovoltaic device locating points, distance between locating points, coefficient of thermal expansion, stiffness, and locating geometry may be combined so as to minimize the variability in spacing and still allow for a degree of adjustability between the two devices. The locator size may be such that it defines a maximum distance between photovoltaic devices such that the maximum device installation error is less than that allowed by the locator. An example can be seen in FIG. 13, where the distance between the pins defines the length between devices and the locator points (e.g. 1210—schematically shown as a, b, c, d, or e as shown in FIG. 14) size with respect to the pin (1220) defines the tolerance. Preferably the device is small in size, so as to minimize CLTE related movement and service bad deflection errors. Preferably the device span between location points is less than 100 mm, more preferably less than 50 mm, most preferably less than 25 mm. The CLTE is most preferably less than 100×10-6 mm/mm° C., more preferably less than 50×10-6 mm/mm° C., most preferably less than 10×10-6. The modulus of elasticity is preferably greater than 2,000 MPa, more preferably greater than 20,000 MPa, most preferably greater than 50,000 MPa.

The locating device may be designed so as to only locate in a single axis or in multiple axis depending on the desired adjustability and if other locating features are already incorporated into the photovoltaic devices. For example a device that locates only in a single direction (FIGS. 11, 12, and 13) may only need to define the distance between two points. This may be desirable when axis perpendicular to the locating points is already limited in motion as shown by the removable secondary device 1100 (e.g. as shown in FIGS. 11, 12). If there are not other locating means, the locator may define position in 2 or more axis as shown in FIG. 14 where locating interfaces are defined in all planes except the mounting plane.

Unless stated otherwise, dimensions and geometries of the various structures depicted herein are not intended to be restrictive of the invention, and other dimensions or geometries are possible. Plural structural components can be provided by a single integrated structure. Alternatively, a single integrated structure might be divided into separate plural components. In addition, while a feature of the present invention may have been described in the context of only one of the illustrated embodiments, such feature may be combined with one or more other features of other embodiments, for any given application. It will also be appreciated from the above that the fabrication of the unique structures herein and the operation thereof also constitute methods in accordance with the present invention.

The preferred embodiment of the present invention has been disclosed. A person of ordinary skill in the art would realize however, that certain modifications would come within the teachings of this invention. Therefore, the following claims should be studied to determine the true scope and content of the invention.

Any numerical values recited in the above application include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes.

The term "consisting essentially of" to describe a combination shall include the elements, ingredients, components or steps identified, and such other elements ingredients, components or steps that do not materially affect the basic and novel characteristics of the combination.

The use of the terms "comprising" or "including" to describe combinations of elements, ingredients, components or steps herein also contemplates embodiments that consist essentially of the elements, ingredients, components or steps.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps. All references herein to elements or metals belonging to a certain Group refer to the Periodic Table of the Elements published and copyrighted by CRC Press, Inc., 1989. Any reference to the Group or Groups shall be to the Group or Groups as reflected in this Periodic Table of the Elements using the IUPAC system for numbering groups.

What is claimed is:

1. A photovoltaic device comprising:
   a polymeric frame; and
   a multi-layered multi-layer laminate structure that includes a connector and electronic circuit assembly;
   wherein the connector and electronic circuit assembly is at least partially encased in the polymeric frame and comprises:
   a connector assembly comprising:
   a connector housing;
   at least one electrical connector protruding from the housing;
   an electronic circuit component comprising:
   at least one bus bar; and
   a connection zone where the at least one electrical connector and the at least one bus bar are joined;
   wherein the connection zone, the connector housing, or both include at least one elastomeric barrier element; and
   wherein the at least one elastomeric barrier element comprises a polyisobutylene tape.

2. The photovoltaic device according to claim 1, wherein the at least one elastomeric barrier element maintains a minimum compression value of 5% to 30% when encased in the polymeric frame.

3. The photovoltaic device according to claim 1, wherein the at least one elastomeric barrier element has a hardness between 20 to 100 Shore A Durometer per ASTM D2240 00.

4. The photovoltaic device according to claim 1, wherein the at least one elastomeric barrier element includes at least one rib structure projecting away from a traverse length of the connector housing.

5. The photovoltaic device according to claim 4, wherein the at least one rib structure has a height ranging between 0.5 mm to 2.5 mm.

6. The photovoltaic device according to claim 1, wherein the at least one elastomeric barrier element maintains an adhesive joint between the connection zone, the connector housing, or both and the polymeric frame between −40° C. and 85° C.

7. The photovoltaic device according to claim 1, wherein the at least one elastomeric barrier element selected from the group consisting of silicone, polychloroprene, butadiene/acrylonitrile copolymer, EPDM rubber, polyurethane, and polyisobutylene.

8. The photovoltaic device of claim 1, wherein the at least one elastomeric barrier element is located between the connection zone and the polymeric frame.

9. The photovoltaic device of claim 8, wherein the polymeric frame is a filled or unfilled moldable plastic.

10. The photovoltaic device of claim 1, wherein the connector and electronic circuit assembly are at least partially encased in the polymeric frame so that the elastomeric barrier element functions to create an adhesive joint between the connection zone, the connector housing, or both.

11. The photovoltaic device of claim 10, wherein the elastomeric barrier element functions to create an adhesive joint between the connection zone, the connector housing, or both and the polymeric frame.

12. The photovoltaic device of claim 11, wherein the connection zone and the connector housing where the elastomeric barrier element extends is encased in the polymeric frame.

13. A photovoltaic device comprising:
a polymeric frame; and
a multi-layered multi-layer laminate structure that includes a connector and electronic circuit assembly;
wherein the connector and electronic circuit assembly is at least partially encased in the polymeric frame and comprises:
    a connector assembly comprising:
        a connector housing;
        at least one electrical connector protruding from the housing;
    an electronic circuit component comprising:
        at least one bus bar; and
    a connection zone where the at least one electrical connector and the at least one bus bar are joined;
        wherein the connection zone, the connector housing, or both include at least one elastomeric barrier element; and
wherein the at least one elastomeric barrier element is a tape at room temperature and the tape is wrapped around the connection zone, the connector housing, or both to form the at least one elastomeric barrier element.

14. The photovoltaic device according to claim 13, wherein the elastomeric element material has a Young's modulus such that a modulus ratio of the frame material to the modulus to the elastomeric element material at 23° C. is at least 500:1, the modulus ratio at −40° C. is at least 50:1, and the modulus ratio at 85° C. is at least 10000:1.

15. The photovoltaic device of claim 13, wherein the at least one elastomeric barrier element is an adhesive joint between the connection zone and the polymeric frame.

16. A photovoltaic device comprising:
a polymeric frame; and
a multi-layered multi-layer laminate structure that includes a connector and electronic circuit assembly;
wherein the connector and electronic circuit assembly is at least partially encased in the polymeric frame and comprises:
    a connector assembly comprising:
        a connector housing;
        at least one electrical connector protruding from the housing;
    an electronic circuit component comprising:
        at least one bus bar; and
    a connection zone where the at least one electrical connector and the at least one bus bar are joined;
        wherein the connection zone, the connector housing, or both include at least one elastomeric barrier element;
wherein the at least one elastomeric barrier element is located between the connector housing and the polymeric frame; and
wherein the at least one elastomeric barrier element is an adhesive joint between the connector housing and the polymeric frame.

17. The photovoltaic device according to claim 16, wherein the at least one elastomeric barrier element comprises a polyisobutylene tape.

18. The photovoltaic device of claim 16, wherein the at least one elastomeric barrier element is a butyl tape.

* * * * *